United States Patent
Wang

(10) Patent No.: US 7,250,676 B2
(45) Date of Patent: Jul. 31, 2007

(54) MULTI-PACKAGE MODULE WITH HEAT SPREADER

(75) Inventor: Meng-Jen Wang, Pingtung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 145 days.

(21) Appl. No.: 11/076,927

(22) Filed: Mar. 11, 2005

(65) Prior Publication Data

US 2006/0091530 A1 May 4, 2006

(30) Foreign Application Priority Data

Mar. 11, 2004 (TW) .............................. 93106547 A

(51) Int. Cl.
*H01L 23/34* (2006.01)
(52) U.S. Cl. ...................... 257/723; 257/778
(58) Field of Classification Search ................ 257/778, 257/712, 723, 737
See application file for complete search history.

(56) References Cited

U.S. PATENT DOCUMENTS 6,936,919 B2 *  8/2005  Chuang et al. ............. 257/717
6,949,826 B2 *  9/2005  Wang .......................... 257/737
6,982,877 B2 *  1/2006  Vinson et al. .............. 361/719
7,081,678 B2 *  7/2006  Liu ............................. 257/778

FOREIGN PATENT DOCUMENTS

TW           558814         10/2003

* cited by examiner

*Primary Examiner*—Roy Karl Potter
(74) *Attorney, Agent, or Firm*—Troxell Law Office, PLLC

(57) ABSTRACT

A multi-package module (MPM) with a heat spreader is disclosed, which comprises a substrate, a chip, a plurality of chip scale packages (CSP), and a heat spreader. The CSPs are disposed on the peripheral region of the substrate, and the chip is disposed on the central region of the substrate among the CSPs. Each CSP has a surface higher than the back surface of the chip to support the heat spreader. The heat spreader has an attachment surface including an extrusion region at the center and a planar region at the periphery. The planar region of the heat spreader is attached to the surfaces of the CSPs, and the extrusion region is thermally coupled to the back surface of the chip to save consumption of thermal interface material (TIM) and a dummy die.

13 Claims, 2 Drawing Sheets

MULTI-PACKAGE MODULE WITH HEAT SPREADER

FIELD OF THE INVENTION

The present invention relates to a multi-package module (MPM), and more particularly, to a MPM with a heat spreader.

BACKGROUND OF THE INVENTION

As semiconductor packages are developing toward lighter, thinner, shorter, and smaller, the integration of a plurality of tested packages and chips inside a single module, such as MPM (multi-package module), becomes more and more popular. Since many packages are assembled onto a single substrate, heat dissipation becomes a serious issue. A conventional MPM with heat spreaders is revealed in R.O.C. Taiwan Patent publication No. 558814, wherein the MPM comprises a substrate, a chip, at least one IC package and a plurality of solder balls. The package and the chip are disposed on the upper surface of the substrate. The package includes at least an encapsulated chip with an encapsulating material. Moreover, heat spreaders are individually assembled in the package and the chip. The solder balls are disposed on the lower surface of the substrate. Since the heat spreaders are disposed individually, which are small, the heat dissipation is poor. Moreover, the assembly processes become more complicated.

Please refer to FIG. 1, a conventional MPM 100 with a heat spreader includes a substrate 110, a semiconductor chip 120, a plurality of CSPs (Chip Scale Package) 130, a dummy die 140 and a heat spreader 150. The substrate 110 has an upper surface 111 and a lower surface 112. A plurality of solder balls 160 are disposed on the lower surface 112 of the substrate 110. The semiconductor chip 120 has an active surface 121 and a back surface 122. A plurality of bumps 123 are formed on the active surface 121 which is attached to the upper surface 111 of the substrate 110 via flip chip methodology. A plurality of electrical terminals 133 are formed on the first surfaces 131 of the CSPs 130 to be attached to the upper surface 111 of the substrate 110. Since the second surfaces 132 of the CSPs 130 are higher than the back surface 122 of the chip 120, a dummy die 140 is interposed between the chip 120 and the heat spreader 150 to compensate the height difference so as to make sure the dummy die 140 is in the same height as the CSPs 130 and to save the consumption of thermal interface material (TIM). Then the heat spreader 150 is attached to the dummy die 140 and CSPs 130. In order to assemble MPM 100, the dummy die 140 has to be lapped, sawed, and attached, the processes become more complicated with higher cost.

SUMMARY OF THE INVENTION

The main purpose of the present invention is to provide a MPM with a heat spreader. A plurality of CSPs (chip scale package) are disposed on the periphery of the substrate, and a chip is disposed on the center of the substrate. A planar heat spreader with an extrusion region at the center is attached to the CSP and the chip. The planar region of the heat spreader is attached to the surfaces of the CSPs, and the extrusion region is attached to the back surface of the chip. The extrusion region at the center of the heat spreader is used to compensate the height difference between the chip and the CSPs so that the assembly cost of the MPM can be reduced and bond line thickness (BLT) of TIM can be controlled.

According to the present invention, the MPM comprises a substrate, a chip, a plurality of CSPs and a heat spreader. The substrate has an upper surface and a lower surface. The upper surface includes a central region and a peripheral region. The chip has an active surface and a back surface. A plurality of bumps are formed on the active surface to dispose the chip on the central region via flip chip methodology. Each CSP has a first surface and an opposing second surface, and a plurality of electrical terminals are formed on the first surface. The CSPs are disposed on the peripheral region of the upper surface of the substrate. The second surfaces of the CSPs are higher than the back surface of the chip. The attachment surface of the heat spreader includes an extrusion region at a center thereof and a planar region at a periphery thereof. When the planar region is attached to the second surfaces of the CSPs, the extrusion region is thermally coupled to the back surface of the chip so that the extrusion region can compensate for the height difference.

DETAIL DESCRIPTION OF THE INVENTION

Please refer to the attached drawings, the present invention will be described by means of an embodiment below.

Figure 1:
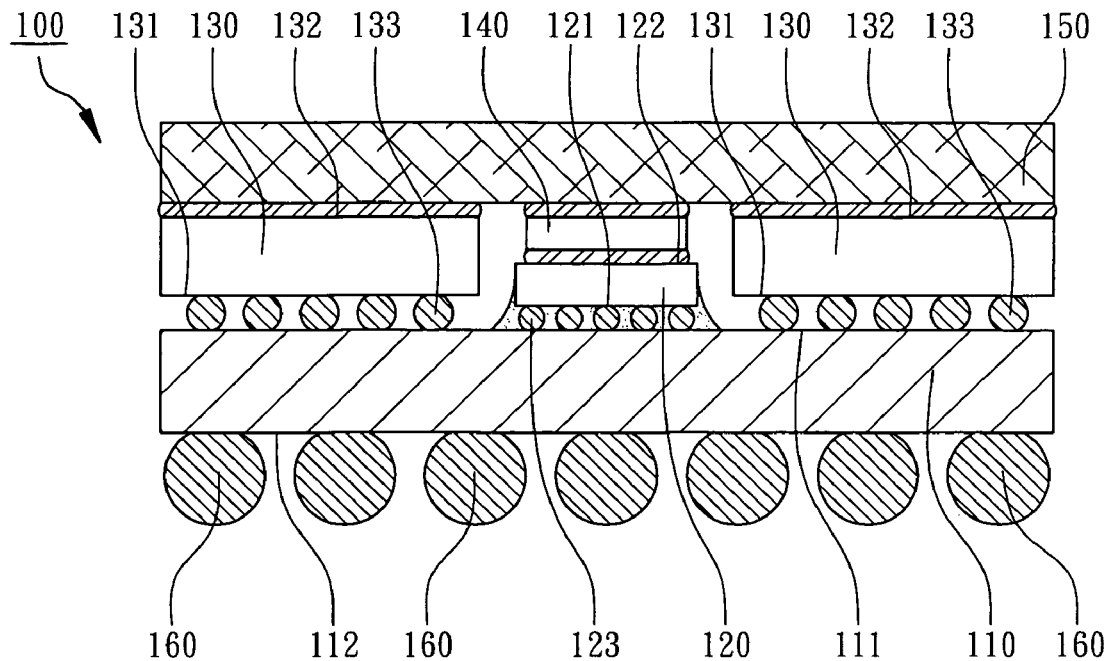
FIG. 1 is a cross-sectional view of a conventional MPM (multi-package module).
Figure 2:
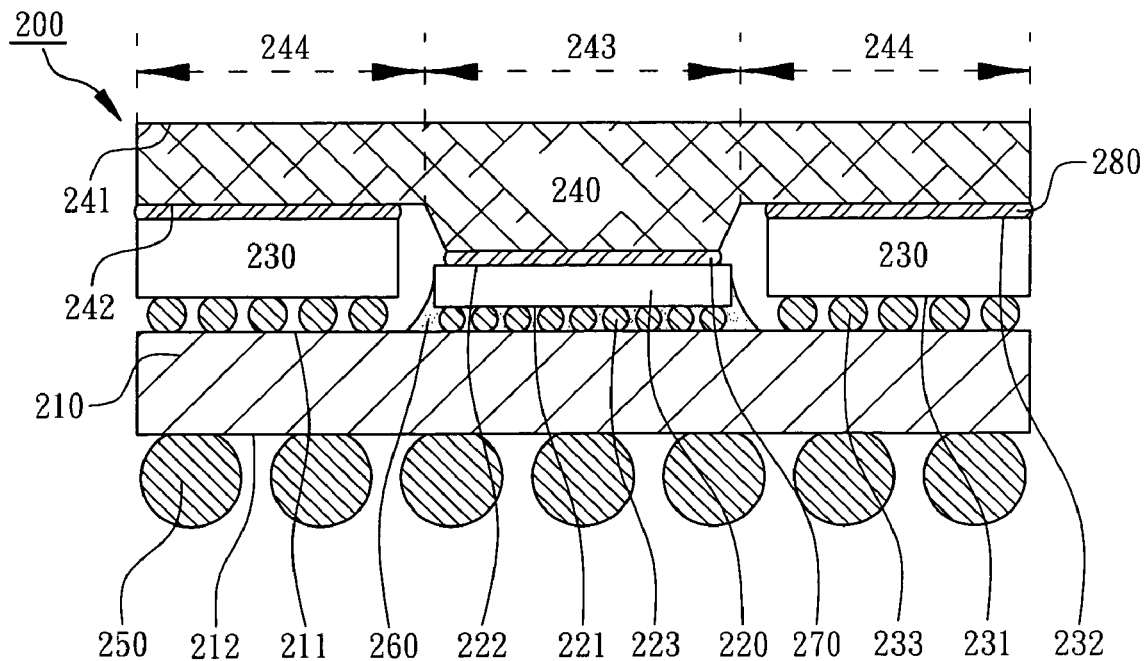
FIG. 2 is a cross-sectional view of a MPM according to a preferred embodiment of the present invention.
Figure 3:
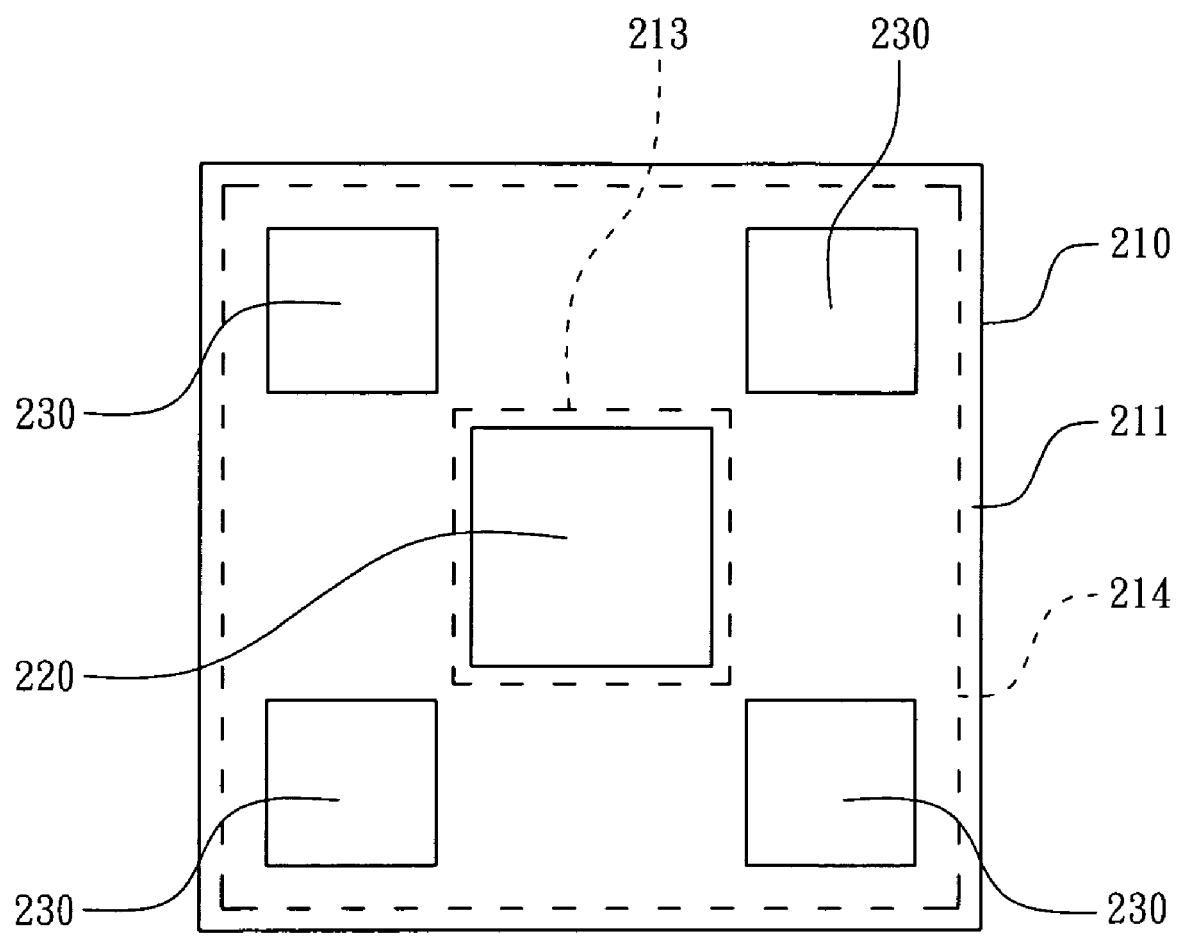
FIG. 3 is a top view of the MPM before attachment of a heat spreader according to the preferred embodiment of the present invention.

The first embodiment according to the present invention is illustrated below. As shown in FIGS. 2 and 3, a MPM 200 with a heat spreader is provided. The MPM 200 can be a flip chip multi-package module (FCMPM), or a thermal-enhanced multi-package flip-chip ball grid array package. The MPM 200 comprises a substrate 210, a chip 220, and a plurality of CSPs 230 and a heat spreader 240. The material of the substrate 210 may be BT, FR-4 or FR-5. The substrate 210 has an upper surface 211 and a lower surface 212. The upper surface 211 includes a central region 213 and a peripheral region 214 (as shown in FIG. 3). A plurality of solder balls 250 are disposed on the lower surface 212 of the substrate 210. The chip 220 has an active surface 221 and a back surface 222. A plurality of bumps 223 are formed on the active surface 221. The chip 220 is disposed on the central region 213 of the upper surface 211 of the substrate 210, and the bumps 223 are connected to the substrate 210 via flip chip methodology. Moreover, the chip 220 is disposed between the CSPs 230. An underfill material 260 is disposed between the chip 220 and the substrate 210 to encapsulate the bumps 223 of the chip 220 for stress dissipation. Each CSP 230 has an first surface 231 and a second surface 232. A plurality of electrical terminals 233 are formed on the first surface 231, such as solder balls or bumps. The CSPs 230 are disposed on the peripheral region 214 of the upper surface 211 of the substrate 210, and the electrical terminals 233 are connected to the substrate 210. The second surfaces 232 of the CSPs 230 are higher than the back surface 222 of the chip 220 to support the heat spreader 240. It will be the best if the dimension of the heat spreader 240 is similar to but not larger than the substrate 210. The heat spreader 240 has a heat dissipation surface 241 and an attachment surface 242. The attachment surface 242 further includes an extrusion region 243 at the center and a planar region 244 at the periphery. The extrusion region 243 can be rectangular or circular in shape. Preferably, the dimension of the extrusion region 243 is not larger than the dimension of the back surface 222 of the chip 220. A first thermal interface material (TIM) 270 is disposed between the extrusion region 243 of the heat spreader 240 and the back surface 222 of the chip 220 so that the extrusion region 243 is thermally coupled to the chip 220. A second TIM 280 or adhesive may be disposed between the planar region 244 of the heat spreader 240 and the second surfaces 232 of the CSPs 230 so that the planar region 244 of the heat spreader 240 is fixed to the second surfaces 232 of the CSPs 230. Therefore, the heat generated from the chip 220 and CSPs 230 can be conducted to the heat spreader 240 and dissipated from the heat dissipation surface 241.

Therefore the planar region 244 of the heat spreader 240 is directly attached to the second surfaces 232 of the CSPs 230 to secure the heat spreader 240 in the MPM 200. Furthermore, the extrusion region 243 of the heat spreader 240 is used to compensate the height difference between the chip 220 and the CSPs 230 so that the back surface 222 of the chip 220 is thermally coupled to the heat spreader 240. Conventional dummy die 140 can be eliminated from the conventional MPM 100 to reduce the assembly cost of MPM. When the height difference between the chip 220 and the CSPs 230 is changed, a different heat spreader 240 with a suitable thickness of the extrusion region 243 can be selected to control the bond line thickness (BLT) of the first TIM 270. Moreover, within the coverage of the present invention, the CSPs 230 are not limited in its package structure and can be any forms of semiconductor packages.

The above description of embodiments of this invention is intended to be illustrative and not limiting. Other interpretations of this invention will be obvious to those skilled in the art in view of the above disclosure.

What is claimed is:

1. A multi-package module comprising:
    a substrate having an upper surface and a lower surface, wherein the upper surface includes a central region and a peripheral region;
    a chip having an active surface and a back surface and including a plurality of bumps on the active surface, wherein the chip is disposed on the central region of the upper surface of the substrate through the bumps;
    a plurality of chip scale packages (CSP), each having a first surface and an opposing second surface and including a plurality of electrical terminals on the first surface, wherein the CSPs are disposed on the peripheral region of the upper surface of the substrate through the electrical terminals, and the second surfaces of the CSPs are higher than the back surface of the chip; and
    a heat spreader having an attachment surface including an extrusion region at a center thereof and a planar region at a periphery thereof, wherein the planar region is attached to the second surfaces of the CSPs, the extrusion region is thermally coupled to the back surface of the chip, and the extrusion region is circular.

2. The multi-package module of claim 1, wherein the extrusion region is not larger than the back surface of the chip.

3. The multi-package module of claim 1, further comprising a first thermal interface material between the extrusion region of the heat spreader and the chip.

4. The multi-package module of claim 3, further comprising a second thermal interface material between the planar region of the heat spreader and the CSPs.

5. The multi-package module of claim 1, further comprising an underfill material to encapsulate the bumps of the chip.

6. The multi-package module of claim 1, further comprising a plurality of solder balls disposed on the lower surface of the substrate.

7. A multi-package module comprising:
    a substrate having an upper surface and a lower surface;
    a flip chip having an active surface and a back surface, wherein the flip chip is disposed on the substrate such that the active surface faces the upper surface;
    at least an IC package having a first surface and an opposing second surface, wherein the IC package is disposed on the substrate such that the first surface faces the upper surface and the second surface of the IC package is higher than the back surface of the chip; and
    a heat spreader having a planar surface and an extrusion protruding from the planar surface, wherein the planar surface is attached to the second surface of the IC package, the extrusion is thermally coupled to the back surface of the flip chip, and the extrusion region is circular.

8. The multi-package module of claim 7, wherein the dimension of the extrusion is not larger than the dimension of the back surface of the flip chip.

9. The multi-package module of claim 7, further comprising a first thermal interface material between the extrusion of the heat spreader and the back surface of the flip chip.

10. The multi-package module of claim 9, further comprising a second thermal interface material between the planar surface of the heat spreader and the second surface of the IC package.

11. The multi-package module of claim 7, further comprising an underfill material between the chip and the substrate.

12. The multi-package module of claim 7, wherein the IC package is a chip scale package.

13. The multi-package module of claim 7, further comprising a plurality of solder balls disposed on the lower surface of the substrate.

* * * * *